United States Patent
Brueck et al.

(10) Patent No.: US 8,969,704 B2
(45) Date of Patent: Mar. 3, 2015

(54) ANNULAR SEMICONDUCTOR ELEMENT AND ANNULAR INSULATION MATERIAL FOR A THERMOELECTRIC MODULE, THERMOELECTRIC MODULE AND METHOD FOR MANUFACTURING THE MODULE

(71) Applicant: EMITEC Gesellschaft fuer Emissionstechnologie mbH, Lohmar (DE)

(72) Inventors: Rolf Brueck, Bergisch Gladbach (DE); Wilfried Mueller, Lindlar (DE); Sigrid Limbeck, Much (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 0 days.

(21) Appl. No.: 13/775,687

(22) Filed: Feb. 25, 2013

(65) Prior Publication Data
US 2013/0167894 A1 Jul. 4, 2013

(30) Foreign Application Priority Data
Aug. 23, 2010 (DE) .................. 10 2010 035 152

(51) Int. Cl.
*H01L 35/32* (2006.01)
*H01L 35/34* (2006.01)
*F01N 5/02* (2006.01)

(52) U.S. Cl.
CPC ................ *H01L 35/32* (2013.01); *F01N 5/025* (2013.01); *H01L 35/34* (2013.01); *Y02T 10/16* (2013.01)
USPC .......................................... 136/208; 136/205

(58) Field of Classification Search
CPC ......... H01L 35/00; H01L 35/02; H01L 35/28; H01L 35/32; H01L 35/34; H01L 23/38; H01L 31/0583; H01L 29/78696
USPC .......... 136/203, 205, 208, 225, 244, 245, 251
See application file for complete search history.

(56) References Cited

U.S. PATENT DOCUMENTS 2,702,828 A 2/1955 Arvin
3,054,840 A 9/1962 Alsing
(Continued)

FOREIGN PATENT DOCUMENTS

DE 3906908 A1 9/1989
DE 10 2006 010 740 A1 9/2007
(Continued)

OTHER PUBLICATIONS

JPH021180 (A)—Jan. 5, 1990 Uematsu et al., English equivalent of the abstract.*
(Continued)

*Primary Examiner* — Susan D Leong
(74) *Attorney, Agent, or Firm* — Laurence A. Greenberg; Werner H. Stemer; Ralph E. Locher

(57) ABSTRACT

An annular semiconductor element for producing a thermoelectric module includes at least one groove extending in a radial direction from an internal circumferential face to an external circumferential face. An annular insulation material insulates n-doped and p-doped semiconductor elements and is accordingly disposed on a lateral face of the semiconductor elements. The insulation material has a slit which extends in the radial direction and divides the insulation material. A thermoelectric module and a method for manufacturing the thermoelectric module are also provided.

9 Claims, 5 Drawing Sheets

(56) References Cited

U.S. PATENT DOCUMENTS

| | | |
|---|---|---|
| 3,601,887 A | 8/1971 | Mitchell |
| 4,879,539 A | 11/1989 | Bessho |
| 5,563,368 A | 10/1996 | Yamaguchi |
| 7,868,242 B2 | 1/2011 | Takahashi |
| 2003/0140957 A1 | 7/2003 | Akiba |
| 2005/0022855 A1 | 2/2005 | Raver |
| 2007/0199587 A1 | 8/2007 | Takahashi |
| 2011/0258995 A1* | 10/2011 | Limbeck et al. ............... 60/320 |

FOREIGN PATENT DOCUMENTS

| | | |
|---|---|---|
| DE | 102008058779 A1 * | 5/2010 |
| EP | 0 644 599 A2 | 3/1995 |
| EP | 0644599 A2 * | 3/1995 |
| EP | 1 780 807 A1 | 5/2007 |
| EP | 1 780 811 A1 | 5/2007 |
| GB | 678 353 A | 9/1952 |
| JP | H021180 A * | 1/1990 |
| JP | 07106641 A | 4/1995 |
| WO | 2007/101468 A1 | 9/2007 |

OTHER PUBLICATIONS

Gao Min et al.: "Ring-structured thermoelectric module", Semiconductor Science and Technology, 22, 2007, pp. 880-883.
International Search Report of PCT/EP2011/064351.

* cited by examiner

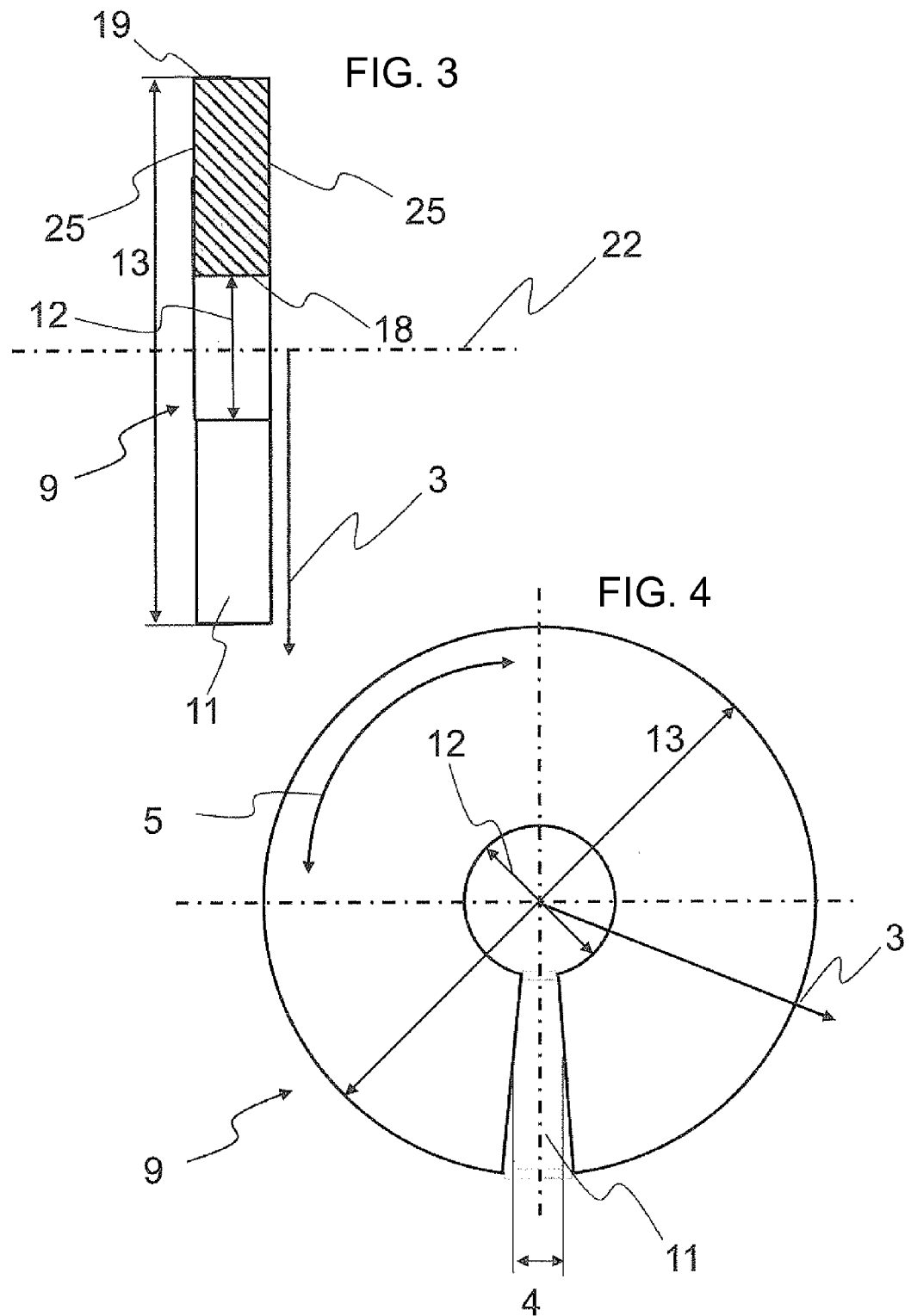

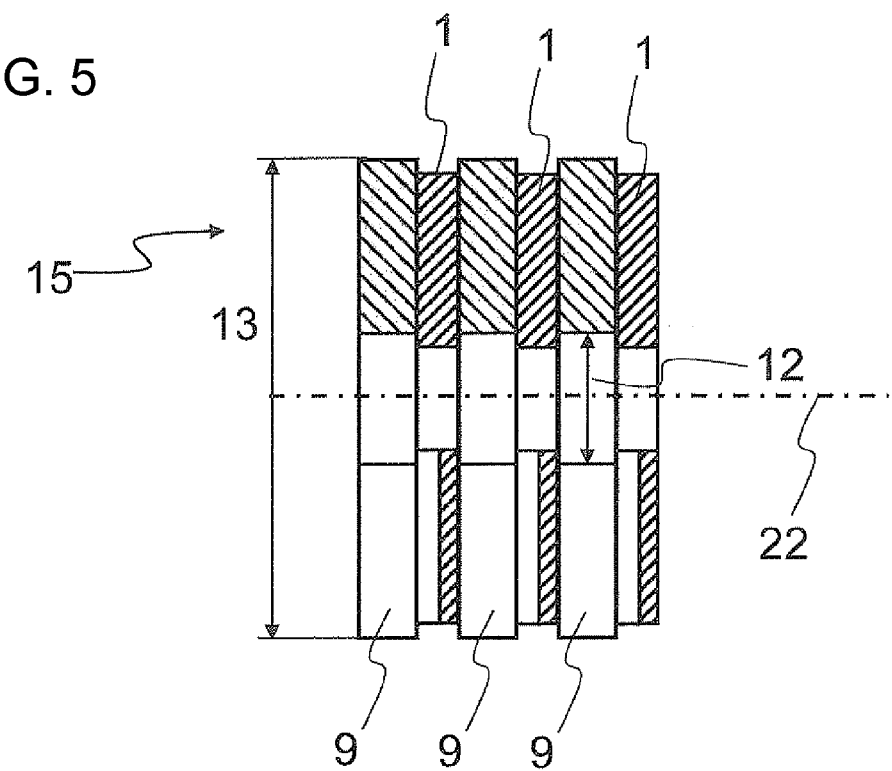
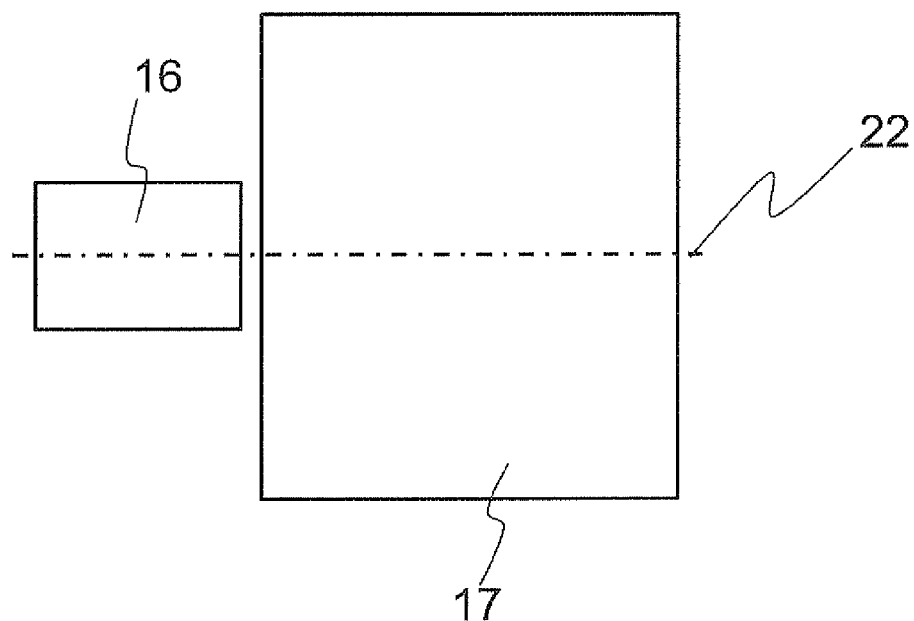

US 8,969,704 B2

ANNULAR SEMICONDUCTOR ELEMENT AND ANNULAR INSULATION MATERIAL FOR A THERMOELECTRIC MODULE, THERMOELECTRIC MODULE AND METHOD FOR MANUFACTURING THE MODULE

CROSS-REFERENCE TO RELATED APPLICATION

This application is a continuation, under 35 U.S.C. §120, of copending International Application No. PCT/EP2011/064351, filed Aug. 22, 2011, which designated the United States; this application also claims the priority, under 35 U.S.C. §119, of German Patent Application DE 10 2010 035 152.0, filed Aug. 23, 2010; the prior applications are herewith incorporated by reference in their entirety.

BACKGROUND OF THE INVENTION

Field of the Invention

The present invention relates to a semiconductor element and an insulation material for insulating semiconductor elements which are disposed one behind the other in an annular fashion. The semiconductor elements and the insulation material are used in a thermoelectric module which forms individually, or in a plurality, a thermoelectric generator which is suitable for converting thermal energy of an exhaust gas into electrical energy. The invention also relates to a thermoelectric module and a method for manufacturing the thermoelectric module.

The exhaust gas from an internal combustion engine of a motor vehicle has thermal energy which can be converted into electrical energy through the use of a thermoelectric generator, for example in order to charge a battery or another energy storage device and/or feed the required energy directly to electrical consumers. The motor vehicle is therefore operated with an improved energetic efficiency level and energy is available for the operation of the motor vehicle to a relatively large extent.

Such a thermoelectric generator has at least a plurality of thermoelectric modules. Such thermoelectric modules preferably have a plurality of thermoelectric elements which are positioned between a so-called hot side and a so-called cold side. Thermoelectric materials which are used for that purpose are dependent on a type which can effectively convert thermal energy into electrical energy (Seebeck effect) and vice versa (Peltier effect). The thermoelectric elements include, for example, at least two semiconductor elements which are respectively p-doped and n-doped and together form the smallest thermoelectric unit. Those semiconductor elements are made of thermoelectric material and are alternately provided on their upper side and underside (toward the hot side or cold side) with electrically conductive bridges, with the result that respectively n-doped and p-doped semiconductor elements are connected to one another. Ceramic plates or ceramic coatings and/or similar materials usually serve for insulating the semiconductor elements with respect to one another or an electrical connection with respect to a housing which accommodates the thermoelectric elements. If a temperature gradient is provided on each side of the semiconductor elements, a voltage potential is formed between the ends of the semiconductor elements. The charge carriers on the relatively hot side are increasingly excited into a conduction band by the relatively high temperature. As a result of the concentration difference in the charge band which is generated in that case charge carriers diffuse onto the relatively cold side of the semiconductor element, as a result of which the difference in potential comes about. In a thermoelectric module, numerous thermoelectric elements are preferably connected electrically in series. In order to ensure that the generated difference in potential between the serial semiconductor elements is not mutually canceled out, semiconductor elements with different majority charge carriers (n-doped and p-doped) are always alternately placed in direct electrical contact. It is possible to close the circuit and therefore tap electrical power through the use of a connected load resistance.

In tubular thermoelectric modules which are suitable, in particular, for use in motor vehicles, semiconductor elements are disposed one behind the other in a circular shape between an inner tube and an outer tube, so that the hot exhaust gas flows over the inner tube or the outer tube. However, the manufacture of the thermoelectric module is very costly because the semiconductor elements have to be disposed between the inner tube and the outer tube, wherein at the same time insulation material and electrically conductive connections have to be provided. In particular, during the construction of such tubular thermoelectric modules it is necessary to ensure that thermal expansion of the individual components, in particular on the hot side, does not limit the function of the thermoelectric module or even cause components within the thermoelectric module to be destroyed.

SUMMARY OF THE INVENTION

It is accordingly an object of the invention to provide an annular semiconductor element and an annular insulation material for a thermoelectric module, a thermoelectric module and a method for manufacturing the thermoelectric module which overcome the hereinafore-mentioned disadvantages and at least partially solve the highlighted problems of the heretofore-known elements, materials, modules and methods of this general type. In particular, a semiconductor element and an insulation material are to be disclosed which are suitable for installation in tubular thermoelectric modules, wherein the structural requirements are at least partially met or simplified. As a result, it is also to be possible to manufacture a temperature-resistant thermoelectric module which is additionally easy and cost-effective to mount.

With the foregoing and other objects in view there is provided, in accordance with the invention, a semiconductor element which is annular and has at least one groove extending in a radial direction from an internal circumferential face to an external circumferential face. The semiconductor element therefore has an external diameter and an internal diameter, as a result of which the semiconductor element can be disposed in the intermediate space between an outer tube and an inner tube of a thermoelectric module. The annular semiconductor element can, in particular, be embodied in a circular, elliptical or even polygonal fashion, and therefore there does not have to be a constant internal diameter or external diameter in the circumferential direction. As a result, "annular" is to be understood, in particular, as a disk-shaped element with an internal hole.

The annular shape of the semiconductor element causes the semiconductor element to have an internal circumferential face and an external circumferential face. The groove then extends from this internal circumferential face to the external circumferential face. The groove is formed in this case in such a way that a reduction in the material thickness (but still not a gap) is provided. As a result, the groove forms, in particular, a predetermined break point for the semiconductor element.

The break point can be used, if appropriate, during mounting and/or during operation of the thermoelectric module. It is therefore possible for stresses which occur during mounting and/or during operation to be reduced through selective fracturing of the groove, and therefore adaptation to the spatial conditions in the thermoelectric module can also be brought about.

In a particularly advantageous way, a plurality of grooves are provided which likewise extend in the radial direction from an internal circumferential face to an external circumferential face, with the result that (coherent) annular segments are formed by the grooves. The annular semiconductor element is disposed in a thermoelectric module in such a way that the external circumferential face or the internal circumferential face is disposed on a hot side, and a cold side is disposed on the corresponding other face. As a result of the temperature potential which is then present across the semiconductor element, a transfer of heat in the radial direction through the semiconductor element is generated, with the result that the semiconductor element can be used to generate a corresponding electrical current.

The efficiency level of the semiconductor element is therefore not, or at least not substantially, restricted by the radially extending groove, should a fracture of the semiconductor element occur therein. There are, in particular, at most eight (8) grooves provided in a semiconductor element extending in a radial direction, in particular distributed regularly on the semiconductor element in the circumferential direction, and therefore dividing the semiconductor element into annular segments.

The semiconductor element can then be used regularly as an annular element during the mounting of a thermoelectric module, therefore making simple handling and also simpler storage of these semiconductor elements possible. At the same time, in this way thermal stresses within a thermoelectric module can, if necessary, be equalized by virtue of the fact that the semiconductor element fractures in the region of a groove, that is to say at the predetermined break point of the semiconductor element. However, since this fracture does not bring about any separation of the semiconductor element in a circumferential direction, but rather in a direction parallel to the flow of heat passing through the semiconductor element, the efficiency level of the semiconductor element is not adversely affected thereby.

In accordance with another particularly advantageous feature of the semiconductor element of the invention, the groove has a width in a circumferential direction of the semiconductor element of at most 0.5 mm [millimeters]. This applies, in particular, to semiconductor elements which have a maximum external diameter of at most 25 mm [millimeters].

In accordance with a further advantageous feature of the semiconductor element of the invention, the groove has such a depth that the semiconductor element has a material thickness in the region of the groove of at most 50% of a wall thickness of the semiconductor element. The semiconductor element usually has a constant wall thickness outside the groove. It is preferred that the semiconductor element has a material thickness in the region of the groove of at most 25% of the wall thickness. In particular, the groove is configured substantially as a rectangle in cross section, that is to say the groove has the same width and depth in the radial direction between the internal circumferential face and the external circumferential face of the semiconductor element. The lateral walls of the groove can extend perpendicularly with respect to the lateral faces of the semiconductor element, but a triangular cross section of the groove is particularly preferred, with the result that in the groove base the lateral walls of the groove run together in a line and therefore a sharp-edged predetermined break point is present.

With the objects of the invention in view, there is also provided an annular insulation material for insulating a semiconductor element and for placement on a lateral face of the semiconductor element, wherein the insulation material has a slit which extends in the radial direction and divides the insulation material.

The insulation material serves, in particular, for electrically insulating n-doped and p-doped semiconductor elements, in particular the semiconductor elements presented above according to the invention. Reference is made to the explanations above with respect to the annular shape.

In this context, the insulation material has a slit which extends in the radial direction and divides the insulation material. In particular, this slit can extend at least partially also in a circumferential direction, with the result that the insulation material has a separation in the circumferential direction between an internal diameter and an external diameter or an internal circumferential face and an external circumferential face.

In accordance with another particularly preferred feature of the invention, the slit has a conical profile, that is to say that the width of the slit in the radial direction from an internal circumferential face to an external circumferential face or from an internal diameter to an external diameter of the insulation material does not extend uniformly but instead, in particular, becomes larger toward the outside. In particular, the slit is shaped in such a way that when the insulation material is compressed in a circumferential direction of the insulation material, the slit in the insulation material is closed in such a way that the external and internal shapes of the insulation material are not significantly changed but instead only the internal diameter and the external diameter, respectively, of the insulation material become smaller. The slit does not restrict the insulation effect of the insulation material in this case. Semiconductor materials which are disposed adjacently are, in particular, connected to one another in an electrically conductive fashion exclusively through their external circumferential face and/or internal circumferential face.

In accordance with a further particularly advantageous feature of the invention, the insulation material has at least a larger internal diameter or a larger external diameter than a semiconductor element which is disposed adjacently. This relationship applies, in particular, before the state of the insulation material and of the semiconductor element in which they are worked to form a thermoelectric module. Instead, in the structural configuration of the thermoelectric module it is ensured that the specified condition is provided in the case of the semiconductor elements and the insulation materials which are present as individual parts. The slit in the insulation material should therefore be at least so wide that compressing the insulation material generates an external diameter or an external circumferential face of the insulation material which, when the slit is completely closed, have at most the absolute value of the external circumference or of the external diameter of the semiconductor element. At the same time, the internal diameter or the internal circumferential face of the insulation material generated in this way should at least be as large as the internal diameter or the internal circumferential face of the corresponding semiconductor element.

Through a corresponding configuration of the semiconductor element and of the insulation material it is then possible to configure these components to form a thermoelectric module and to obtain a planar external circumferential face or internal circumferential face of this tubular semiconductor element by compressing the insulation material. In particular, the semiconductor element and/or the insulation material has a planar construction, that is to say it has at least one planar lateral face. Both lateral faces preferably have a planar construction. As a result of the planar embodiment of the lateral faces, a configuration of semiconductor elements and insulation materials one behind the other is possible. The semiconductor element and the adjacent insulation material are correspondingly in contact over their entire planar lateral face.

With the objects of the invention in view, there is furthermore provided a thermoelectric module which has at least one semiconductor element according to the invention and at least one insulation material according to the invention. It is preferred in this case that the semiconductor elements and the insulation materials be disposed alternately one after the other (for example in the manner of a stack).

With the objects of the invention in view, there is concomitantly provided a method for manufacturing such a thermoelectric module (preferably according to the invention) which comprises at least the following steps:

a) placing each of at least one semiconductor element (preferably according to the invention) and one insulation material (preferably according to the invention) alternately one behind the other to form a tubular element;
b) providing an inner tube and an outer tube;
c) placing the tubular element between the inner tube and the outer tube; and
d) calibrating or sizing at least the inner tube and/or the outer tube so that the tubular element has at least one smooth internal circumferential face and/or one smooth external circumferential face.

In particular, the n-doped and p-doped semiconductor elements and insulation materials are disposed (on the outside) on the inner tube, wherein the inner tube has a smaller external diameter than the smallest internal diameter of the tubular element, composed of semiconductor elements and insulation materials. The outer tube preferably has a smallest internal diameter which is larger than the correspondingly largest external diameter of the tubular element, composed of semiconductor elements and insulation materials. The calibration, scaling or gauging of the inner tube and/or of the outer tube results, in particular, in a plastic change of the shape of the inner tube and/or of the outer tube, in particular in such a way that the inner tube is widened and/or the outer tube is reduced. As a result, secure abutment of the inner tube and/or of the outer tube against the semiconductor elements and insulation materials can be achieved.

If, in this context, locally high stresses are introduced into the module due to fabrication tolerances, those stresses can be reduced in the semiconductor elements according to the invention through the grooves (predetermined break points) and/or the gaps/slits in the insulation materials, without the functionality of the thermoelectric module being put at risk in the process.

At least the inner tube and/or the outer tube preferably has electrically conductive connections and, in particular, also electrical insulation, with the result that the n-doped and p-doped semiconductor elements which are disposed alternately one behind the other and spaced apart from insulation materials are each electrically connected to one another in a selective fashion at their external circumferential faces and internal circumferential faces. As a result of this electrically conductive connection of the semiconductor elements (beyond the annular insulation materials), an electric current can be generated through the thermoelectric module and can be fed to consumers or storage devices. In particular, in this context electrically conductive connections for electrically connecting n-doped and p-doped semiconductor elements are disposed on the external circumferential face and in an alternating fashion therewith on the internal circumferential face in such a way that they also have recesses in the region of the grooves of the semiconductor elements.

Furthermore, a semiconductor element or an insulation material is proposed which has on a lateral face a recess which is suitable for accommodating solder or brazing material. It is herewith expressly stated that this is a further, in particular independent, invention which can be delineated from the present invention at a later time. The statements below relating to a semiconductor element can be applied in the same way to an insulation material.

The semiconductor element is, in particular annular and has, on at least one lateral face, a recess which extends in the circumferential direction. This recess extends on the lateral face as far as the internal circumferential face or as far as the external circumferential face of the semiconductor element and is, in particular, embodied in such a way that it runs completely all around. When a thermoelectric module is manufactured it is possible, for example, to place annular solder or brazing material in these recesses. After mounting, in particular at least of the components including the inner tube, insulation, electrically conductive connection on the internal circumferential side of the semiconductor elements, semiconductor elements with solder or brazing material, insulation material and electrically conductive connection on the external circumferential side of the semiconductor elements, a soldering or brazing process can be carried out. As a result of this soldering or brazing process, the solder or brazing material in the recesses is molten on and is distributed independently to the selected connecting points due to the capillary effect. Furthermore, the recess can also be provided as a solder or brazing material reservoir, with the result that an excess of solder or brazing material can escape into the recess and/or remains there.

The semiconductor element or insulation material can, in particular, also have other shapes than the specified annular shape. In particular, annular-segment-shaped, cuboid-shaped or cylindrical semiconductor elements and/or insulation material are suitable.

Other features which are considered as characteristic for the invention are set forth in the appended claims, noting that the features which are specified individually in the claims can be combined with one another in any desired technically appropriate way and present further refinements of the invention. Advantageous refinements of the invention and the integration of these elements or materials into superordinate structural units and a method for manufacturing these superordinate structural units are disclosed in the dependent claims.

Although the invention is illustrated and described herein as embodied in an annular semiconductor element and an annular insulation material for a thermoelectric module, a thermoelectric module and a method for manufacturing the thermoelectric module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 3 is a cross-sectional view of an insulation material;

FIG. 4 is a side-elevational view of an insulation material;

FIG. 5 is a longitudinal-sectional view of a tubular element according to method step a);

FIG. 6 is a side-elevational view of an inner tube and an outer tube according to method step b);

DETAILED DESCRIPTION OF THE INVENTION

Figure 1:
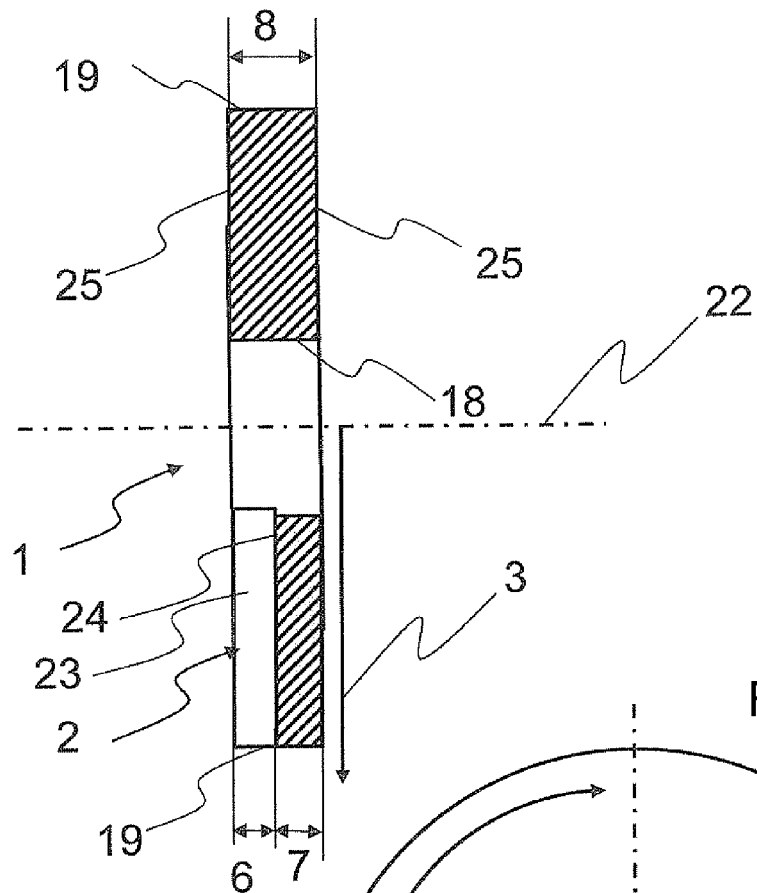
FIG. 1 is a diagrammatic, cross-sectional view of a semiconductor element.

Referring now to the figures of the drawings in detail and first, particularly, to FIG. 1 thereof, there is seen a semiconductor element 1 in a cross section. The semiconductor element 1 is embodied in an annular shape and has a central axis 22. It also has an internal circumferential or peripheral face 18, an external circumferential or peripheral face 19, and a groove 2 which extends in a radial direction 3 from the internal circumferential face 18 as far as the external circumferential face 19. Furthermore, the semiconductor element 1 has a wall thickness 8 between lateral faces 25. The wall thickness 8 is reduced to a material thickness 7 in the region of the groove 2 because the groove has a depth 6. The groove 2 is bounded by lateral walls 23 and a groove base 24.

Figure 2:
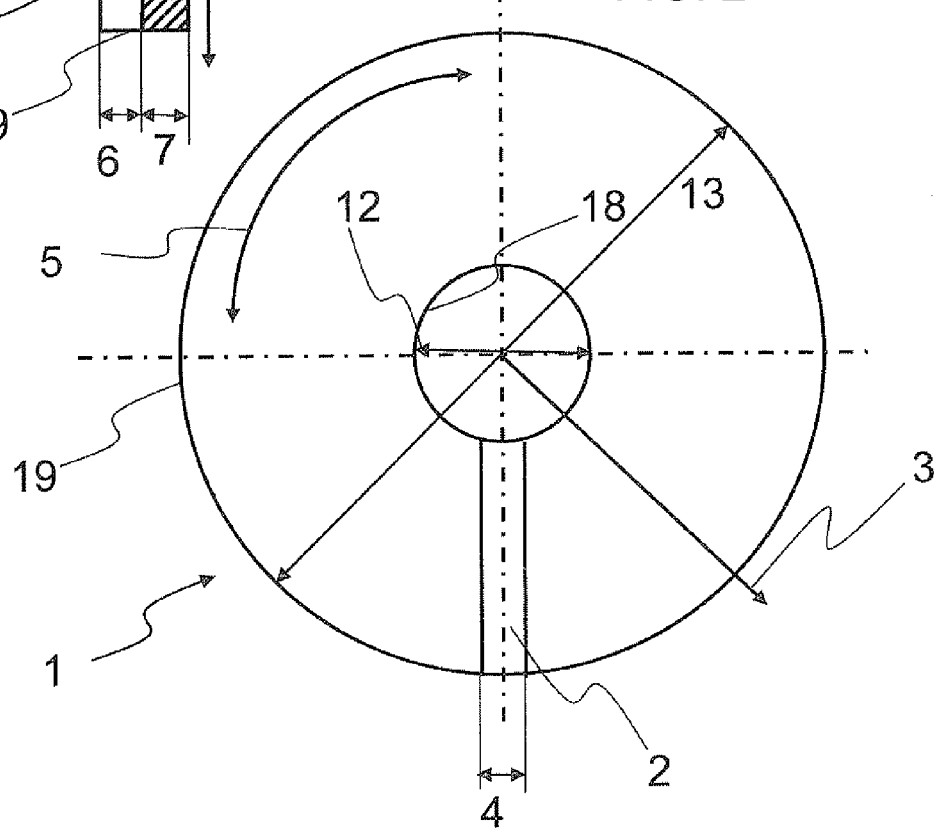
FIG. 2 is a side-elevational view of a semiconductor element.

FIG. 2 shows the semiconductor element 1 of FIG. 1 in a side view, in which it is seen that the semiconductor element 1 is bounded on the inside by the internal circumferential face 18 and on the outside by the external circumferential face 19. The semiconductor element 1 also has an external diameter 13 and an internal diameter 12. The groove 2, which has a width 4, extends between the internal circumferential face 18 and the external circumferential face 19, with the width 4 being considered in a circumferential direction 5. The groove 2 extends in the radial direction 3 and therefore forms a predetermined break point for the semiconductor element 1.

FIG. 3 shows an insulation material 9 in cross section. The insulation material 9 is provided with an annular shape around a central axis 22 and has an internal diameter 12 and an external diameter 13 as well as lateral faces 25 which bound the insulation material 9. Furthermore, a slit 11 is provided which extends in a radial direction 3 through the insulation material 9.

FIG. 4 shows the insulation material 9 of FIG. 3 in a side view. The slit 11 has a conical construction in this case in the radial direction and accordingly has a central width 4 (which is different in the radial direction). The slit 11 accordingly extends from the internal diameter 12 to the external diameter 13 in the radial direction 3 and therefore divides the insulation material 9 in the circumferential direction 5.

FIG. 5 shows a method step a), according to which insulation materials 9 and semiconductor elements 1 are alternately disposed one behind the other in the direction of a central axis. The semiconductor elements 1 are respectively disposed alternately as n-doped and p-doped semiconductor elements 1. A tubular element 15, which is therefore assembled along the central axis 22, has an external diameter 13 which is formed by the external diameter 13 of the insulation material 9. Furthermore, it is apparent that the internal diameter 12 of the insulation materials 9 is greater than the internal diameter 12 of the semiconductor elements 1 disposed next to them.

FIG. 6 shows the method step b), in which an inner tube 16 and an outer tube 17 are provided which are run together along a central axis 22 in a concentric fashion to form a housing of the thermoelectric module and accommodate the tubular element 15 in an intermediate space formed in this way.

Figure 7:
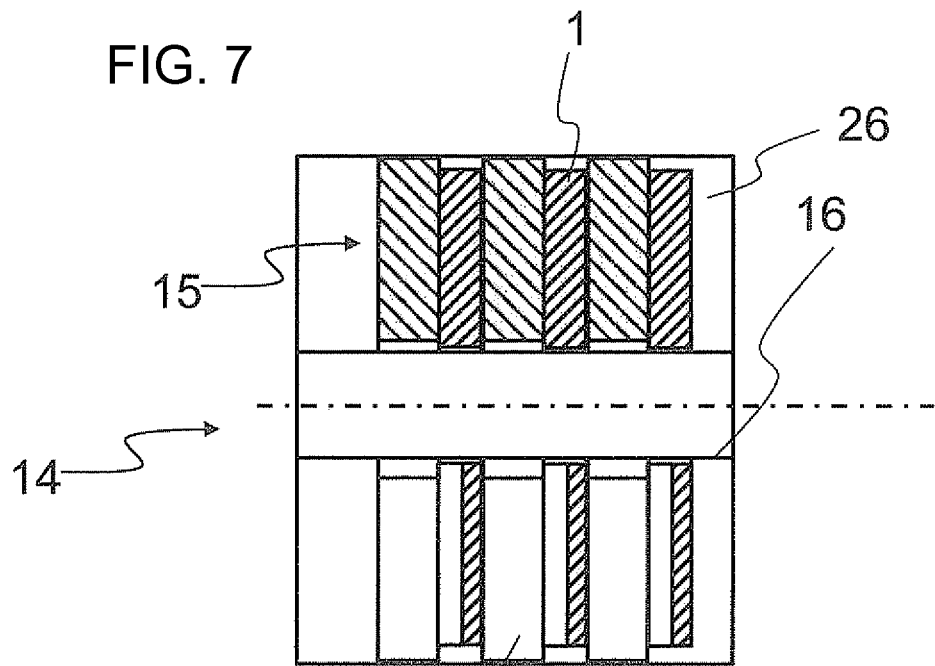
FIG. 7 is a longitudinal-sectional view illustrating method step c)

FIG. 7 shows method step c) according to which the tubular element 15 is disposed inside the outer tube 17 and around the inner tube 16 in an intermediate space 26 in order to construct a thermoelectric module 14. The configuration of the tubular element 15 inside the outer tube 17 and on the inner tube 16 is illustrated in the stress-free state, that is to say that at that time no radial forces are acting on the insulation materials 9 or the semiconductor elements 1.

Figure 8:
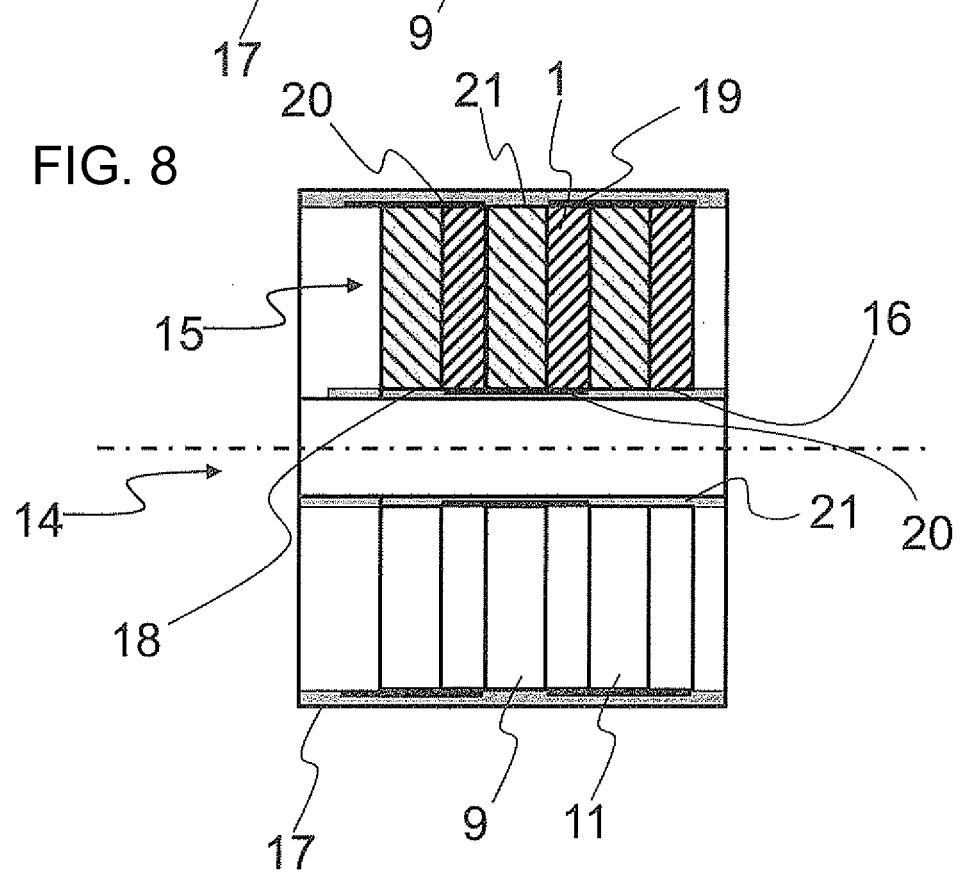
FIG. 8 is a longitudinal-sectional view of the thermoelectric module after the calibration of at least one tube.

FIG. 8 shows the method step d) according to which the tubular element 15 is now disposed inside the outer tube 17 and on the inner tube 16 and correspondingly forms a thermoelectric module 14. As a result of the calibration or sizing of the outer tube 17 or of the inner tube 16, at least the insulation materials 9 are compressed in such a way that a smooth external circumferential face 19 is formed, which is generated by the external circumferential faces of the insulation materials 9 and of the semiconductor elements 1. At the same time, preferably a smooth internal circumferential face 18 is produced, which is formed by the internal circumferential faces 18 of the insulation materials 9 and of the semiconductor elements 1. Furthermore, electrically conductive connections 20 and insulations 21 are disposed in such a way that a mutual electrically conductive connection of the semiconductor elements 1 is made possible through the external circumferential faces 19 and/or the internal circumferential faces 18 of the tubular element 15, and insulation 21 with respect to the inner tube 16 and the outer tube 17 is respectively ensured. FIG. 8 also shows that the grooves of the semiconductor elements 1 have brought about a radial fracture of the semiconductor elements 1 as a result of the calibration of the inner tube 16 or of the outer tube 17 or as a result of thermal stresses during operation.

Figure 9:
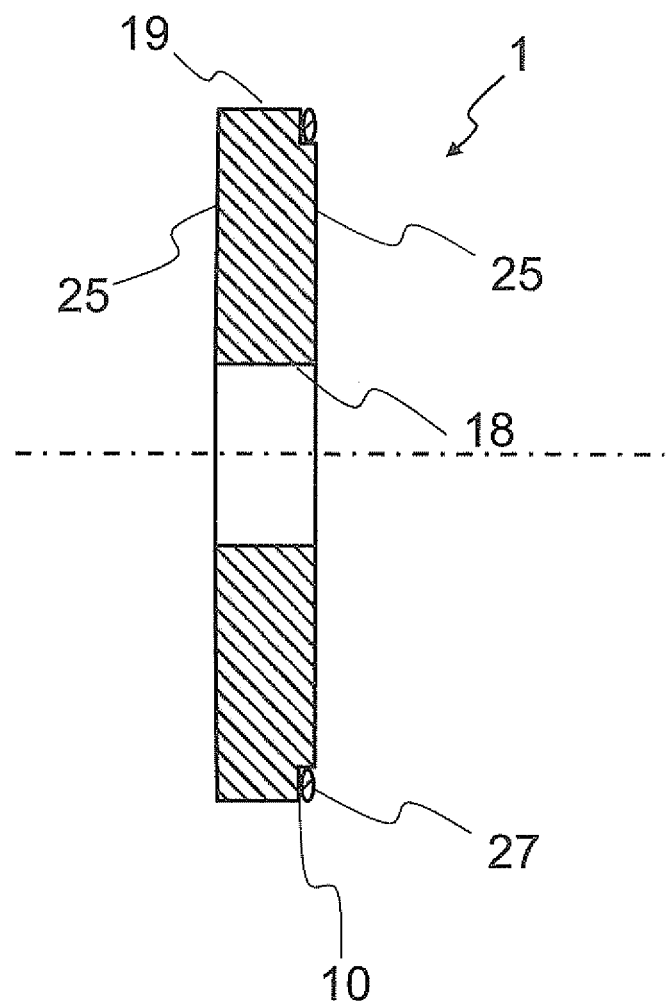
FIG. 9 is a cross-sectional view of a semiconductor element with recesses.

FIG. 9 shows an annular semiconductor element 1 with lateral faces 25 and an internal circumferential face 18 as well as an external circumferential face 19. A recess 10 is disposed on the lateral face 25 in the region of the external circumferential face 19 in which a solder or brazing material 27 is disposed.

The invention claimed is:

1. An annular semiconductor element, comprising:
   an internal circumferential face;
   an external circumferential face;
   a radial direction; and
   at least one groove extending in said radial direction from said internal circumferential face to said external circumferential face of the annular semiconductor element.

2. The semiconductor element according to claim 1, which further comprises a circumferential direction, said groove having a width in said circumferential direction of at most 0.5 mm.

3. The semiconductor element according to claim 1, which further comprises a wall thickness, said groove having a depth dimensioned to leave the semiconductor element in vicinity of said groove with a material thickness of at most 50% of said wall thickness.

4. An annular insulation material for insulating a semiconductor element and for placement on a lateral face of the semiconductor element, the annular insulation material comprising:
- a compressible material;
- a radial direction; and
- a slit extending in said radial direction and dividing the annular insulation material, said slit being at least so wide that compressing the insulation material to a position where said slit is completely closed generates an external diameter or an external circumferential face of the insulation material having at most an absolute value of an external diameter or of an external circumference of the semiconductor element.

5. The insulation material according to claim 4, wherein said slit has a conical extent.

6. The insulation material according to claim 4, which further comprises at least a larger internal diameter or at least a larger external diameter than the semiconductor element disposed adjacent the insulation material.

7. A thermoelectric module, comprising:
- at least one annular semiconductor element having a lateral face, an internal circumferential face, an external circumferential face, a radial direction and at least one groove extending in said radial direction from said internal circumferential face to said external circumferential face; and
- at least one annular insulation material for insulating said at least one annular semiconductor element and for placement on said lateral face of said at least one annular semiconductor element;
- said at least one annular insulation material having a radial direction and a slit extending in said radial direction and dividing said at least one annular insulation material.

8. A method for manufacturing a thermoelectric module according to claim 7, the method comprising the following steps:
- a) placing semiconductor elements and insulation materials alternately one behind another to form a tubular element;
- b) providing an inner tube and an outer tube;
- c) placing the tubular element between the inner tube and the outer tube; and
- d) calibrating at least the inner tube or the outer tube to configure the tubular element with at least one of a smooth internal circumferential face or a smooth external circumferential face.

9. The thermoelectric module according to claim 7, wherein said slit is at least so wide that compressing the insulation material to a position where said slit is completely closed generates an external diameter or an external circumferential face of the insulation material that has at most an absolute value of an external diameter or of an external circumference of the semiconductor element.

* * * * *